United States Patent
Humfeld et al.

(10) Patent No.: US 10,006,123 B2
(45) Date of Patent: Jun. 26, 2018

(54) SPECIES CONTROLLED CHEMICAL VAPOR DEPOSITION

(71) Applicant: The Boeing Company, Chicago, IL (US)

(72) Inventors: Keith Daniel Humfeld, Federal Way, WA (US); De'Andre James Cherry, Ladson, SC (US)

(73) Assignee: THE BOEING COMPANY, Chicago, IL (US)

( * ) Notice: Subject to any disclaimer, the term of this patent is extended or adjusted under 35 U.S.C. 154(b) by 0 days. days.

(21) Appl. No.: 15/151,203

(22) Filed: May 10, 2016

(65) Prior Publication Data

US 2017/0327950 A1 Nov. 16, 2017

(51) Int. Cl.
*C23C 16/46* (2006.01)
*C23C 16/455* (2006.01)

(52) U.S. Cl.
CPC ............ *C23C 16/46* (2013.01); *C23C 16/455* (2013.01)

(58) Field of Classification Search
None
See application file for complete search history.

(56) References Cited

U.S. PATENT DOCUMENTS

| | | | |
|---|---|---|---|
| 4,668,365 A * | 5/1987 | Foster | C23C 16/045 118/50.1 |
| 5,789,085 A | 8/1998 | Blohowiak et al. | |
| 5,814,137 A | 9/1998 | Blohowiak et al. | |
| 5,849,110 A | 12/1998 | Blohowiak et al. | |
| 5,869,140 A | 2/1999 | Blohowiak et al. | |
| 5,869,141 A | 2/1999 | Blohowiak et al. | |
| 5,939,197 A | 8/1999 | Blohowiak et al. | |
| 5,993,678 A * | 11/1999 | Ohkawa | C23C 16/50 |
| 6,037,060 A | 3/2000 | Blohowiak et al. | |
| 6,362,098 B1 * | 3/2002 | Breeden | C23C 16/045 257/E21.279 |
| 6,506,499 B1 | 1/2003 | Blohowiak et al. | |
| 6,605,365 B1 | 8/2003 | Krienke et al. | |
| 7,001,666 B2 | 2/2006 | Krienke et al. | |
| 7,563,513 B2 | 7/2009 | Krienke et al. | |
| 7,713,347 B2 | 5/2010 | Krienke | |
| 7,811,374 B2 | 10/2010 | Osborne et al. | |

(Continued)

OTHER PUBLICATIONS

Keith Daniel Humfeld, "Growth of Carbon Nanotube (CNT) Leads on Circuits in Substrate-Free Continuous Chemical Vapor Deposition (CVD) Process", U.S. Appl. No. 14/853,004, filed Sep. 14, 2015.

*Primary Examiner* — Joseph A Miller, Jr.
(74) *Attorney, Agent, or Firm* — MH2 Technology Law Group LLP

(57) ABSTRACT

A method for chemical vapor deposition on a substrate is disclosed. The method may include directing a process gas into a reaction chamber, and heating the process gas in the reaction chamber. Heating the process gas in the reaction chamber may decompose the process gas to thereby generate a plurality of decomposition products. The method may also include applying one or more biasing fields and/or waves to the process gas upstream of the substrate, and reacting the process gas with the substrate. The one or more biasing fields and/or waves may include electromagnetic waves, electric fields, and/or magnetic fields. The biasing fields and/or waves may urge at least a portion of the process gas towards or away from the substrate.

14 Claims, 3 Drawing Sheets

(56) References Cited

U.S. PATENT DOCUMENTS

| | | |
|---|---|---|
| 8,206,501 B2 | 6/2012 | Krienke |
| 8,450,202 B1 | 5/2013 | Humfeld |
| 8,697,179 B2 | 4/2014 | Osborne et al. |
| 8,715,609 B2 | 5/2014 | Humfeld et al. |
| 9,117,883 B2 | 8/2015 | Humfeld |
| 2001/0008798 A1* | 7/2001 | Naito .................... C23C 16/511 438/689 |
| 2002/0153103 A1* | 10/2002 | Madocks ............ C23C 16/4412 156/345.29 |
| 2003/0189202 A1* | 10/2003 | Li ......................... B82Y 10/00 257/14 |
| 2004/0259362 A1* | 12/2004 | Chen ....................... C23C 14/06 438/689 |
| 2005/0221002 A1* | 10/2005 | Nakamura .......... C23C 16/4581 427/248.1 |
| 2013/0264711 A1 | 10/2013 | Humfeld |
| 2014/0212353 A1 | 7/2014 | Humfeld et al. |
| 2015/0342059 A1 | 11/2015 | Humfeld |

* cited by examiner

SPECIES CONTROLLED CHEMICAL VAPOR DEPOSITION

TECHNICAL FIELD

The present teachings relate to the field of materials fabrication, and more particularly, to systems and methods for controlling growth of materials in a chemical vapor deposition (CVD) system.

BACKGROUND

Chemical vapor deposition (CVD) is a process used to produce many materials, such as thin films and/or carbon nanotubes (CNTs). In CVD, the materials (e.g., the thin films, CNTs, etc.) may be produced by exposing a substrate or a catalyst to volatile precursors. For example, in a CVD chamber or reactor, a gaseous feedstock or process gas may be directed to the substrate, which is maintained at elevated temperatures (e.g., about 450° C. to about 800° C.). As the process gas approaches the substrate, the elevated temperatures may decompose the process gas to produce a cloud or soup of decomposition products (e.g., the volatile precursors) that may react with the substrate or the catalyst.

The cloud of decomposition products, however, includes a plurality of chemical species, and each of the chemical species may react differently with the substrate or the catalyst, thereby producing materials with varying properties. Additionally, impurities associated with the process gas may also react with the substrate or the catalyst to produce materials with varying properties. Accordingly, high-grade filters and/or high purity reagents may often be utilized to reduce the amount of impurities associated with the process gas and the variability in the decomposition products. Utilizing the high-grade filters and the high purity reagents, however, may make the production of the materials via the CVD process cost-prohibitive and/or impractical.

What is needed, then, is an improved CVD system and methods for controlling chemical species directed to or available for reacting with a substrate.

SUMMARY

The following presents a simplified summary in order to provide a basic understanding of some aspects of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

Examples of the disclosure may provide a method for chemical vapor deposition on a substrate. The method may include directing a process gas into a reaction chamber, and heating the process gas in the reaction chamber. Heating the process gas in the reaction chamber may decompose the process gas to thereby generate a plurality of decomposition products. The method may also include applying one or more biasing fields and/or waves to the process gas upstream of the substrate, and reacting the process gas with the substrate. The one or more biasing fields and/or waves may include electromagnetic waves, electric fields, and/or magnetic fields. The biasing fields and/or waves may urge at least a portion of the process gas towards or away from the substrate.

Examples of the disclosure may also provide another method for chemical vapor deposition on a substrate. The method may include directing a process gas into a reaction chamber of a chemical vapor deposition system, and heating the process gas in the reaction chamber with a furnace. Heating the process gas with the furnace may decompose the process gas, thereby generating a plurality of decomposition products. The method may also include urging a portion of the process gas towards or away from the substrate by applying one or more biasing fields and/or waves to the process gas upstream of the substrate. The one or more biasing fields and/or waves may include electromagnetic waves, electric fields, and/or magnetic fields. The method may further include reacting the process gas with the substrate to deposit a product on the substrate.

Examples of the disclosure may further provide a chemical vapor deposition system. The chemical vapor deposition system may include a chemical vapor deposition reactor having a substrate disposed therein. An inlet manifold may be fluidly coupled with the chemical vapor deposition reactor and configured to introduce a process gas thereto. The chemical vapor deposition reactor may include a reaction chamber and a furnace. The reaction chamber may define a reaction space between a first axial end portion and a second axial end portion thereof, and the furnace may extend about the reaction chamber to heat the reaction space. The chemical vapor deposition system may also include a biasing device configured to apply one or more biasing fields and/or waves to at least a portion of the process gas upstream of the substrate.

The features, functions, and advantages that have been discussed can be achieved independently in various implementations or may be combined in yet other implementations further details of which can be seen with reference to the following description and drawings.

BRIEF DESCRIPTION OF THE DRAWINGS

The accompanying drawings, which are incorporated in and constitute a part of this specification, illustrate the present teachings and together with the description, serve to explain the principles of the disclosure. In the figures.

It should be noted that some details of the Figures have been simplified and are drawn to facilitate understanding of the present teachings rather than to maintain strict structural accuracy, detail, and scale.

DETAILED DESCRIPTION

Reference will now be made in detail to examples of the present teachings, which are illustrated, in the accompanying drawings. Wherever possible, the same reference numbers will be used throughout the drawings to refer to the same or like parts.

Figure 1:
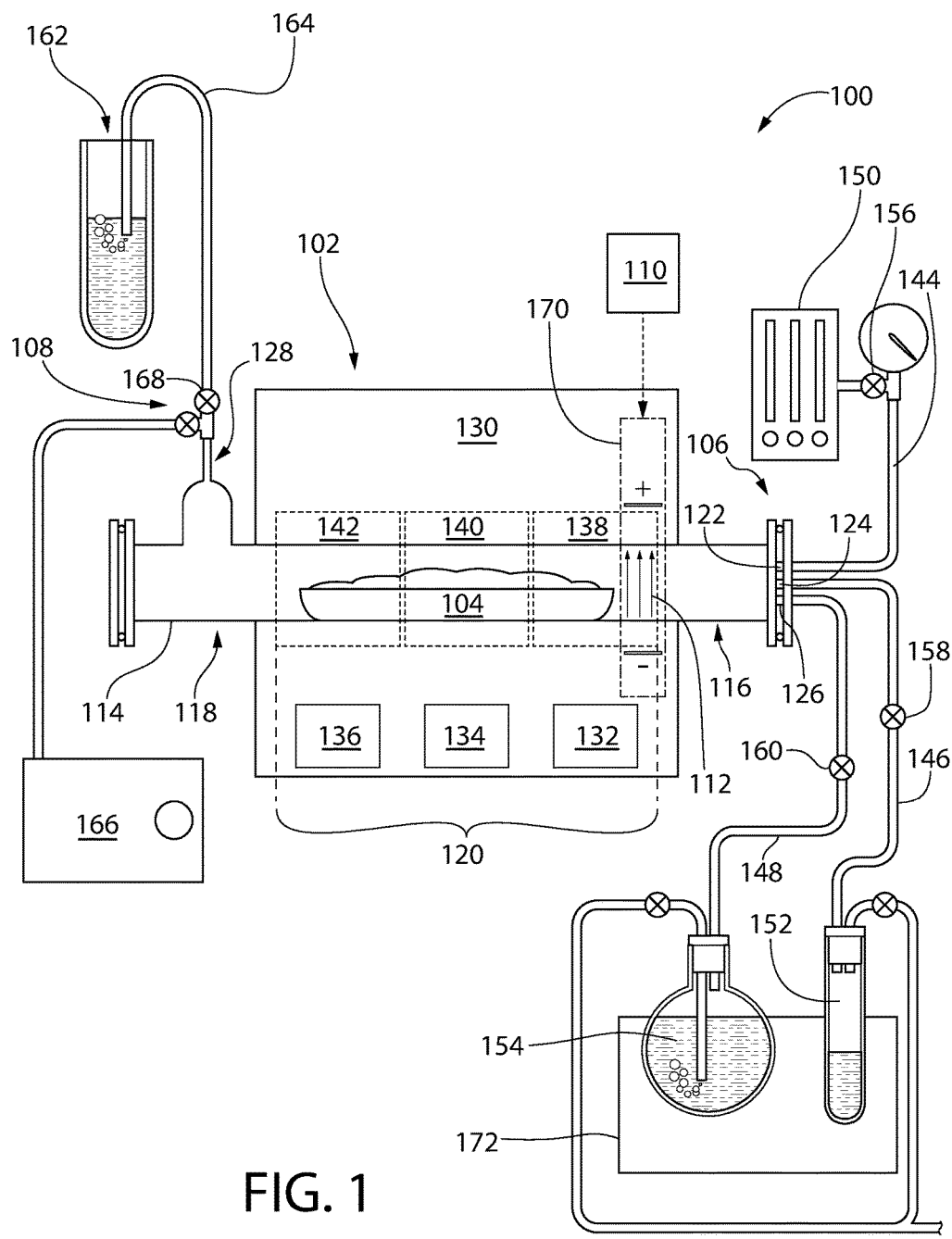
FIG. 1 illustrates a schematic side view of an exemplary chemical vapor deposition (CVD) system.

FIG. 1 illustrates a schematic side view of a chemical vapor deposition (CVD) system 100, accordingly to an example. The CVD system 100 includes a CVD reactor 102, an inlet manifold 106 configured to introduce one or more process gases to the CVD reactor 102, an exhaust manifold 108 configured to exhaust the unreacted process gases, and a biasing device 110 configured to apply a biasing force 112 to at least a portion of the process gases directed to and/or contained in the CVD reactor 102. A substrate 104 configured to react with the one or more process gases may be disposed in the CVD reactor 102. As used herein, the expression "biasing force" refers to a force exerted on at least a portion of the process gases via one or more electric fields, magnetic fields, electromagnetic waves, and the like, that is sufficient to urge or promote the migration of the at least a portion of the process gases.

The CVD reactor 102, illustrated as a conventional CVD tube furnace, includes a reaction chamber 114. In at least one example, illustrated in FIG. 1, the reaction chamber 114 may be cylindrical. The reaction chamber 114 may be made of quartz or alumina. The reaction chamber 114 may be supported between a first axial end portion 116 and a second axial end portion 118 thereof. The first and second axial end portions 116, 118 of the reaction chamber 114 define a reaction space 120 at least partially extending therebetween. The first axial end portion 116 of the reaction chamber 114 defines one or more inlets (three are shown 122, 124, 126) configured to receive the process gases from the inlet manifold 106. The second axial end portion 118 of the reaction chamber 114 defines one or more outlets (one is shown 128) fluidly coupled with the exhaust manifold 108 and configured to exhaust the unreacted process gases from reaction chamber 114. The substrate 104 may be disposed in the reaction space 120 of the reaction chamber 114 and configured to react with the process gases directed thereto. While the CVD reactor 102 is illustrated as a conventional CVD tube furnace, it should be appreciated that any kind or type of CVD reactor 102 may be used. For example, atmospheric pressure CVD reactors, low pressure CVD reactors, plasma-enhanced CVD reactors, atomic layer deposition reactors, or the like, are contemplated in the scope of the present disclosure.

The CVD reactor 102 includes a furnace 130 extending about the reaction chamber 114 and configured to heat the reaction space 120 thereof. The furnace 130 may include one or more heating elements (three are shown 132, 134, 136) disposed axially along and/or circumferentially about the reaction space 120. The heating elements 132, 134, 136 may be operated in conjunction with one another to create a single heating zone in the reaction space 120. The heating elements 132, 134, 136 may also be operated separately to create a plurality of heating zones (three are shown 138, 140, 142) in the reaction space 120. For example, each of the heating elements 132, 134, 136 may be operated separately to heat each of the respective heating zones 138, 140, 142.

The inlet manifold 106 is fluidly coupled with the one or more inlets 122, 124, 126 of the reaction chamber 114 and configured to introduce one or more process gases to the CVD reactor 102. The inlet manifold 106 includes one or more lines (three are shown 144, 146, 148) fluidly coupling each of the inlets 122, 124, 126 of the reaction chamber 114 with a respective process gas source 150, 152, 154. For example, as illustrated in FIG. 1, line 144 fluidly couples a first process gas source 150 with the first inlet 122, line 146 fluidly couples a second process gas source 152 with the second inlet 124, and line 148 fluidly couples a third process gas source 154 with the third inlet 126. The inlet manifold 106 may include one or more valves (three are shown 156, 158, 160) fluidly coupled with lines 144, 146, 148, respectively, and configured to regulate or control a flow of the process gases flowing therethrough.

The exhaust manifold 108 includes a vent or exhaust 162 fluidly coupled with the outlet 128 of the reaction chamber 114 via line 164 and configured to receive the unreacted process gases therefrom. The exhaust manifold 108 may also be configured to regulate a pressure in the reaction chamber 114. For example, the exhaust manifold 108 may include a pump 166 (e.g., rotary pump) fluidly coupled with the outlet 128 and configured to regulate the pressure in the reaction chamber 114. A valve 168 may be fluidly coupled with line 164 and configured to regulate a flow of the unreacted process gas from the reaction chamber 114 to the exhaust 162.

As previously discussed, the biasing device 110 is configured to apply one or more biasing forces 112 to at least a portion of the process gases directed to or contained in the CVD reactor 102. For example, the biasing device 110 is configured to generate and/or direct one or more biasing fields and/or waves 170, and the biasing fields and/or waves 170 apply the one or more biasing forces 112 to at least a portion of the process gases directed to or contained in the CVD reactor 102. Illustrative biasing fields and/or waves include, but are not limited to, electric fields, magnetic fields, electromagnetic waves, or the like, or any combination thereof. The biasing device 110 may be disposed near, adjacent, and/or about the CVD reactor 102.

The biasing device 110 is configured to control or vary the energy, frequency, intensity, and/or magnitude of the biasing fields and/or waves 170. Varying the energy, frequency, intensity, and/or magnitude of the biasing fields and/or waves 170 may vary the degree in which the portion of the process gases are segregated and/or the degree in which the portion of the process gases migrate. In some examples, the portion of the process gases that are affected by the biasing fields and/or waves 170 may be impacted by the frequency. The energy, intensity, and/or magnitude of the biasing fields and/or waves 170 may be increased or decreased by increasing or decreasing the strength of the biasing fields and/or waves 170, respectively. For example, a magnitude of an electric field may be varied by varying the voltage of the biasing device 110. The biasing device 110 is also configured to increase or decrease the frequency of the electromagnetic wave. The frequency of an electromagnetic wave can be adjusted via a variable filter and a broad wavelength source. The frequency of the electromagnetic wave may also be adjusted via a variable wavelength laser. The biasing device 110 is also configured to control or vary the direction or orientation of the biasing fields and/or waves 170. For example, the biasing device 110 is configured to control the orientation of the magnetic field, particularly, the relative location of the positive and negative poles of the magnetic field.

The biasing device 110 includes any device capable of generating and/or applying electric fields, magnetic fields, electromagnetic waves, or the like, or any combination thereof. For example, the biasing device 110 may be or include a loosely wound solenoid, a permanent magnet, an electromagnet, or the like, configured to generate and apply a magnetic field to at least a portion of the process gas directed to or contained in the CVD reactor 102. In another example, the biasing device 110 may be or include a light, a laser, or the like, configured to generate and apply an electromagnetic wave to at least a portion of the process gas directed to or contained in the CVD reactor 102. In yet another example, the biasing device 110 may be or include a pair of parallel plates, a configuration of electrical leads capable of supporting a differential voltage or a voltage difference, or the like, configured to generate and apply an electric field to at least a portion of the process gas directed to or contained in the CVD reactor 102.

The biasing device 110 is configured to apply the biasing fields and/or waves 170 anywhere in, through, along, and/or about the CVD reactor 102. The segregation or migration of the portion of the process gases occurs where the biasing fields and/or waves 170 are applied. In at least one example, the biasing device 110 is configured to apply the biasing fields and/or waves 170 to the process gases prior to deposition on and/or reaction with the substrate 104. Applying the biasing fields and/or waves 170 to the process gas prior to deposition on and/or reaction with the substrate 104 may urge at least a portion of the process gas toward or away from the substrate 104. In another example, the biasing device 110 may be configured to apply the biasing fields and/or waves 170 in, through, and/or at one or more of the heating zones 138, 140, 142. For example, the biasing device 110 may be configured to apply the biasing fields and/or waves 170 in the first heating zone 138, the second heating zone 140, and/or the third heating zone 142. In another example, the biasing device 110 may be configured to apply the biasing fields and/or waves 170 at or near the substrate 104. For example, the biasing device 110 may be configured to apply the biasing fields and/or waves 170 adjacent the substrate 104. In another example, the biasing device 110 may be configured to apply the biasing fields and/or waves 170 upstream of the substrate 104. The flow of the process gases through the reaction chamber 114 may at least partially determine the distance and/or position in which the biasing fields and/or waves 170 are applied relative to the substrate 104. For example, if the flow of the process gases in the reaction chamber 114 allow the segregated portion of the process gas to remain segregated, then the biasing fields and/or waves 170 may be applied further upstream of the substrate 104. In another example, if the flow of the process gases in the reaction chamber 114 allows the segregated portion of the process gas to remix with or contact the main stream, then the biasing fields and/or waves 170 may be applied closer to the substrate 104 to reduce the ability of the segregated portion from reaching or contacting the substrate 104.

The biasing device 110 may also be configured to apply the biasing fields and/or waves 170 upstream of any one or more of the heating zones 138, 140, 142. For example, the biasing device 110 may be configured to apply the biasing fields and/or waves 170 at or near the first end portion 116 of the reaction chamber 114, upstream of each of the heating zones 138, 140, 142. In another example, the biasing device 110 may be configured to apply the biasing fields and/or waves 170 at or adjacent the first end portion 116 of the reaction chamber 114. In yet another example, the biasing device 110 may be configured to apply the biasing fields and/or waves in the first heating zone 138 and upstream of the first heating zone 138 (e.g., at or near the first end portion 116 of the reaction chamber 114). As further described herein, the biasing forces 112 applied to the process gases by the biasing fields and/or waves 170 may urge or promote the migration of at least a portion of the process gases toward or away from the substrate 104.

In an exemplary operation of the CVD system 100, with continued reference to FIG. 1, the substrate 104 may be disposed in the reaction space 120 of the reaction chamber 114. The furnace 130 heats the reaction space 120 and the substrate 104 disposed therein to a temperature sufficient to decompose the process gases. Illustrative substrates include, but are not limited to, graphite, quartz, silicon, silicon carbide, silica, alumina, alumino-silicate, parylene, or the like, and combinations thereof. In at least one example, a catalyst may be disposed on or coupled with the substrate 104 to facilitate a reaction with the process gases, thereby promoting the formation of a product on the substrate 104. For example, a metal catalyst (e.g., iron, cobalt, nickel, copper, gold, platinum, tungsten-cobalt alloy, etc.) may be disposed on the substrate 104.

The inlet manifold 106 directs the process gases from the respective process gas sources 150, 152, 154 to the reaction chamber 114. Each of the process gas sources 150, 152, 154 may be a gas, a liquid, or a solid. Illustrative process gas sources include, but are not limited to, methane, ethylene, acetylene, benzene, xylene, carbon monoxide, ethanol, dibutyl phthalate (DBP), paralene, Parylene-C dimer (dichloro-[2,2]paracyclophane, diX-C), or the like, and combinations thereof. When the process gas source is a gas or a mixture of gases, the gas or the mixture of gases may be flowed directly to the reaction chamber 114. For example, as illustrated in FIG. 1, the first process gas source 150 is a gas or a mixture of gases that may be flowed directly to the reaction chamber 114 without any additional processing. When the process gas source is a liquid, a heater 172 may be utilized to vaporize the liquid, and an inert gas may be utilized as a carrier to direct the vaporized liquid into the reaction chamber 114. For example, as illustrated in FIG. 1, the heater 172 may vaporize the liquids of the second and third process gas sources 152, 154, and the inert gas (e.g., nitrogen) may carry the vaporized liquids into the reaction space 120 of the reaction chamber 114 via lines 146, 148. In addition to, or in substitution of the heater 172, the CVD system 100 may include a bubbler (not shown) configured to remove at least a portion of any one or more impurities contained in the process gas. For example, the process gas may be bubbled or passed through a liquid contained in the bubbler, and the liquid may contact at least a portion of the impurities such that the impurities remain in the liquid while the process gas, which contains a lower concentration of the impurities, is passed to the inlet manifold 106.

As previously discussed, the furnace 130 heats the reaction space 120 to a temperature sufficient to decompose or dissociate at least a portion of the process gases. For example, the furnace 130 may heat the reaction space 120 to a temperature from about 400° C., about 450° C., about 500° C., about 550° C., about 600° C., or about 650° C. to about 700° C., about 750° C., about 800° C., about 850° C., about 900° C., about 950° C., or higher. The heat or thermal energy of the furnace 130 decomposes the process gases to produce a plurality of varying decomposition products or chemical species. As such, the decomposition of the process gases in the reaction space 120 produces a cloud or soup of the decomposition products in the reaction chamber 114. For example, acetylene, which is commonly used in the production of carbon nanotubes (CNTs) decomposes into a plurality of varying chemical species, such as a plurality of polycyclic aromatic hydrocarbons species, propane, propene, ethylene, ethane, or the like, and combinations thereof. Illustrative decomposition products and chemical species may include, but are not limited to, polarizable species, ionic species, polar species, nonpolar species, or the like, and any combination thereof. It should be appreciated that each of the varying decomposition products may have or exhibit varying properties. For example, the decomposition products may have varying magnetic moments or dipole moments, ionic charges, geometries, molecular shapes, molecular masses, electric dipoles, electronegativity, relative permittivity, or the like, and any combination thereof. It should further be appreciated that the process gases, prior to decomposition, may also include a plurality of varying chemical species. For example, the process gases directed to the reaction chamber 114 may have or be associated with an impurity or a plurality impurities that may exhibit varying properties (e.g., dipole moments, ionic charges, geometries, etc.). For example, silane and/or oxygen, the process gases utilized in the formation of silicon dioxide (e.g., silicon dioxide films), are not electrically polarizable and have no magnetic moment. Silane and/or oxygen, however, are often associated with an impurity or a plurality of impurities, such as phosphine, which is electrically polarizable and has a magnetic moment.

As previously discussed, the biasing device 110 applies the biasing fields and/or waves 170 to the CVD reactor 102. The biasing fields and/or waves 170, which include the electric fields, the magnetic fields, and/or the electromagnetic waves, urge or promote the migration of at least a portion of the process gases towards or away from the substrate 104. As illustrated in FIG. 1, the biasing device 110 may direct the biasing fields and/or waves 170 upstream of the substrate 104 to control the chemical species available or directed to the substrate 104. Accordingly, the biasing fields and/or waves 170 may act as a filter (e.g., an energy filter) to select or control the chemical species available to react with or directed to the substrate 104. For example, the biasing fields and/or waves 170 (e.g., the electric fields, the magnetic fields, and/or the electromagnetic waves) may apply the biasing forces 112 to the process gases to selectively urge an impurity, a plurality of impurities, and/or decomposition products away from the substrate 104. Similarly, the biasing fields and/or waves 170 may apply the biasing forces 112 to the process gases to selectively urge the impurity, the plurality of impurities, and/or the decomposition products towards the substrate 104. For example, an electric field may be applied to the process gases to direct polar chemical species, such as phosphine, away from the substrate 104, while allowing nonpolar chemical species to remain relatively unaffected and available for reaction with the substrate 104.

It should be appreciated that the ability to control the chemical species directed to or available to react with the substrate 104 may provide increased control over deposition or growth on the substrate 104. For example, directing the impurity and/or the impurities of the process gases away from the substrate 104 may increase the purity of the films formed on the substrate 104. Controlling the chemical species directed to or available to react with the substrate 104 may also allow the growth or deposition of various products or materials on the substrate 104 to be studied. For example, the decomposition of acetylene in the production or growth of CNTs provides varying decomposition products and/or chemical species having varying properties, and the role of each of these decomposition products and/or chemical species in the growth of CNTs is not known. Accordingly, the ability to separate or control the chemical species directed to or available to react with the substrate 104 based on the properties thereof, may allow the mechanism for growing the CNTs to be further studied. The ability to separate or control the chemical species directed to or available to react with the substrate 104 based on the properties thereof may also allow for the optimization of CNTs growth or production. For example, water is a polar molecule that facilitates the growth of CNTs at relatively low concentrations and hinders the growth of CNTs at relatively high concentrations. Accordingly, the ability to control the amount of water directed to or available to react with the substrate 104 based on its polar property may allow the growth of the CNTs to be optimized.

In at least one example, the CVD system 100 may be modified such that a first process gas may impact the substrate 104, and a second process gas may not impact the substrate 104 unless acted on by the biasing fields and/or waves 170. For example, in the production of aluminum films, a first stream containing hydrogen and carbon dioxide gases may be flowed into the reaction chamber 114 from a first inlet (not shown), such that the hydrogen and carbon dioxide gases impact or are available for reaction with the substrate 104, and a second stream containing aluminum chloride may be flowed into the reaction chamber 114 from a second inlet (not shown), such that the aluminum chloride only impacts the substrate when acted upon by the biasing fields and/or waves (e.g., a magnetic field) 170. For example, the biasing fields and/or waves 170 may act on the second stream to draw the aluminum chloride towards the substrate 104.

Figure 2:
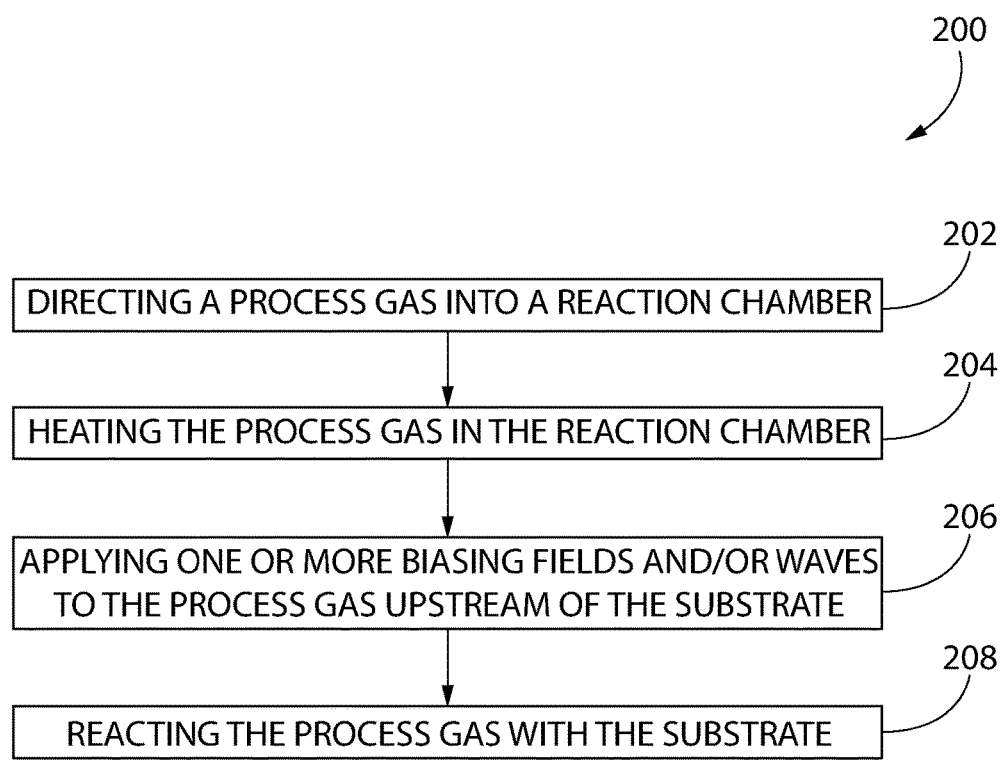
FIG. 2 illustrates a flowchart of an exemplary method for chemical vapor deposition on a substrate.

FIG. 2 illustrates a flowchart of a method 200 for chemical vapor deposition on a substrate, according to an example. The method 200 may include directing a process gas into a reaction chamber, as at 202. The method 200 may also include heating the process gas in the reaction chamber, as at 204. Heating the process gas in the reaction chamber may decompose the process gas, thereby generating a plurality of decomposition products. The method 200 may further include applying one or more biasing fields and/or waves to the process gas upstream of the substrate, as at 206. The one or more biasing fields and/or waves may include electromagnetic waves, electric fields, and/or magnetic fields. The biasing fields and/or waves may urge at least a portion of the process gas (e.g., a decomposition product, a plurality of decomposition products, an impurity, a plurality of impurities, etc.) towards or away from the substrate. The method 200 may also include reacting the process gas with the substrate, as at 208. The process gas may react with a catalyst disposed on the substrate.

Figure 3:
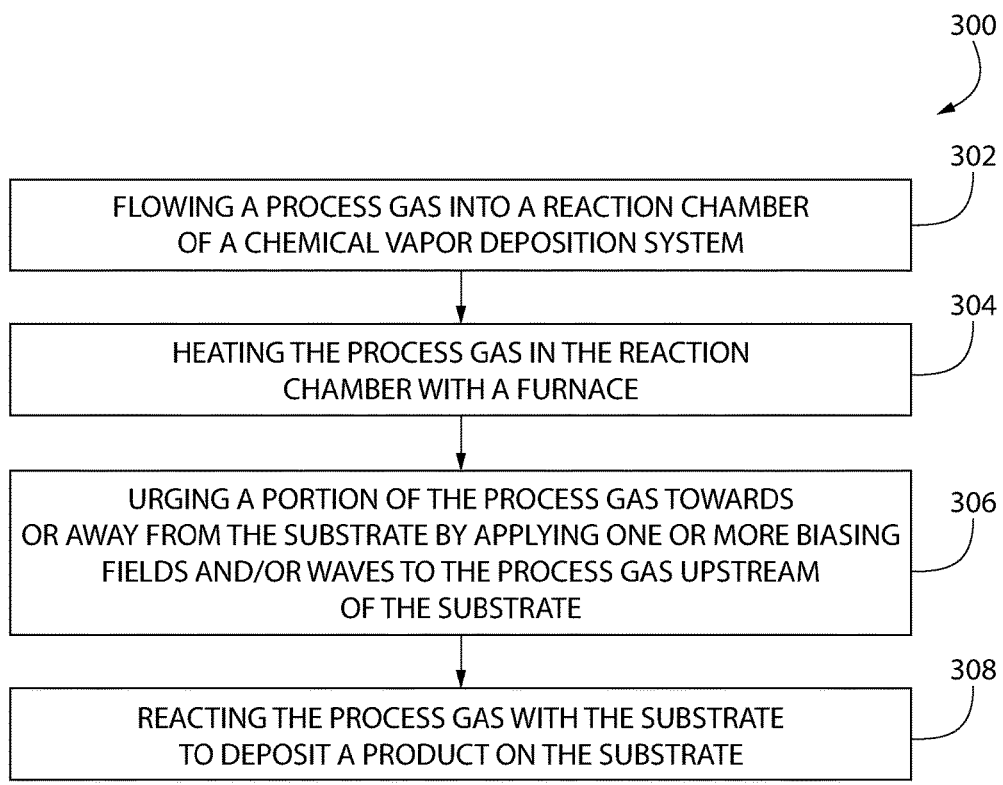
FIG. 3 illustrates a flowchart of another exemplary method for chemical vapor deposition on a substrate.

FIG. 3 illustrates a flowchart of another method 300 for chemical vapor deposition on a substrate, according to an example. The method 300 may include directing a process gas into a reaction chamber of a chemical vapor deposition system, as at 302. The method 300 may also include heating the process gas in the reaction chamber with a furnace, as at 304. The method 300 may further include urging a portion of the process gas towards or away from the substrate by applying one or more biasing fields and/or waves to the process gas upstream of the substrate, as at 306. The method 300 may also include reacting the process gas with the substrate to deposit a product on the substrate, as at 308.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. It will be appreciated that structural components and/or processing stages can be added or existing structural components and/or processing stages can be removed or modified. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the present teachings. Finally, "exemplary" indicates the description is used as an example, rather than implying that it is an ideal. The present disclosure provides specific implementations without being exhaustive, and other implementations of the present teachings may be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A method for chemical vapor deposition on a substrate, comprising:
    directing a process gas into a reaction chamber;
    decomposing the process gas in the reaction chamber to form a decomposition product in the process gas;
        applying one or more biasing fields and/or waves to the process gas laterally adjacent and upstream of the substrate such that the fields and/or waves urge at least a portion of the process gas away from the substrate;
        reacting the decomposition product of the process gas with a surface of the substrate to deposit a product on the surface,
        wherein the one or more biasing fields and/or waves are applied in a direction substantially perpendicular to the surface of the substrate,
        wherein the one or more biasing fields and/or waves comprise a magnetic field, an electromagnetic wave, or combinations thereof.

2. The method of claim 1, wherein the biasing fields and/or waves further comprises an electric field.

3. The method of claim 1, wherein the biasing fields and/or waves apply a biasing force to at least a portion of the process gas.

4. The method of claim 3, wherein decomposing of the process gas produces a plurality of decomposition products, and the biasing force urges at least one of the plurality of decomposition products away from the substrate.

5. The method of claim 1, wherein the one or more biasing fields and/or waves consists of an electric field and at least one of a magnetic field or an electromagnetic wave.

6. A method for a chemical vapor deposition on a substrate, comprising:
    directing a process gas into a reaction chamber of a chemical vapor deposition system;
    decomposing the process gas in the reaction chamber with a furnace disposed about the reaction chamber to form a decomposition product in the process gas;
    urging the decomposition product of the process gas towards or away from the substrate by applying one or more biasing fields and/or waves to the process gas upstream of the substrate; and
    reacting the decomposition product of the process gas with a surface of the substrate to deposit a product on the surface of the substrate,
    wherein reacting the decomposition product with the surface of the substrate to deposit the product on the surface of the substrate comprises facilitating a reaction between the decomposition product and the substrate with a catalyst deposited on the substrate,
    wherein the one or more biasing fields and/or waves are applied in a direction substantially perpendicular to the surface of the substrate, and
    wherein the one or more biasing fields and/or waves comprise a magnetic field, an electromagnetic wave, or combinations thereof.

7. The method of claim 6, wherein the biasing fields and/or waves further comprises an electric field.

8. The method of claim 6, wherein the process gas comprises an impurity, and the biasing fields and/or waves urge the impurity away from the substrate.

9. The method of claim 6, wherein decomposing of the process gas produces a plurality of decomposition products, and the biasing force urges at least one of the plurality of decomposition products away from the substrate.

10. The method of claim 6, wherein decomposing of the process gas produces a plurality of decomposition products, and the biasing force urges at least one of the plurality of decomposition products towards the substrate.

11. The method of claim 6, further comprising varying an intensity of the biasing fields and/or waves applied to the process gas.

12. The method of claim 6, wherein the one or more biasing fields and/or waves consists of an electric field and at least one of a magnetic field or an electromagnetic wave.

13. The method of claim 6, wherein the one or more biasing fields and/or waves are applied to the process gas at a position laterally adjacent and upstream to the surface of the substrate.

14. The method of claim 6, wherein the one or more biasing fields and/or waves consists of a magnetic field or an electromagnetic wave.

* * * * *